United States Patent
Matsuzawa et al.

(10) Patent No.: US 12,050,737 B2
(45) Date of Patent: Jul. 30, 2024

(54) OPERATION DEVICE ENABLING BOTH PUSH AND SWIPE OPERATION

(71) Applicant: KABUSHIKI KAISHA TOKAI RIKA DENKI SEISAKUSHO, Aichi (JP)

(72) Inventors: Takahiko Matsuzawa, Aichi (JP); Kaoru Wada, Aichi (JP)

(73) Assignee: KABUSHIKI KAISHA TOKAI RIKA DENKI SEISAKUSHO, Aichi (JP)

( * ) Notice: Subject to any disclaimer, the term of this patent is extended or adjusted under 35 U.S.C. 154(b) by 0 days.

(21) Appl. No.: 18/033,879

(22) PCT Filed: Oct. 27, 2021

(86) PCT No.: PCT/JP2021/039678
§ 371 (c)(1),
(2) Date: Apr. 26, 2023

(87) PCT Pub. No.: WO2022/097553
PCT Pub. Date: May 12, 2022

(65) Prior Publication Data
US 2023/0400935 A1 Dec. 14, 2023

(30) Foreign Application Priority Data
Nov. 5, 2020 (JP) ................. 2020-185170

(51) Int. Cl.
*G06F 3/0338* (2013.01)
*B60H 1/00* (2006.01)
(Continued)

(52) U.S. Cl.
CPC ......... *G06F 3/0338* (2013.01); *B60H 1/0065* (2013.01); *B60H 1/00985* (2013.01);
(Continued)

(58) Field of Classification Search
CPC .............. G06F 3/0338; G06F 3/03547; G06F 2203/0339; B60H 1/0065; B60H 1/00985;
(Continued)

(56) References Cited

U.S. PATENT DOCUMENTS
2020/0377020 A1* 12/2020 Ramgopal ............... B60R 11/04

FOREIGN PATENT DOCUMENTS
| JP | 2014-125181 | 7/2014 |
| JP | 2014-206924 | 10/2014 |
| WO | 2018/066269 | 4/2018 |

OTHER PUBLICATIONS
International Search Report issued in International Patent Application No. PCT/JP2021/039678, dated Dec. 21, 2021.

* cited by examiner

*Primary Examiner* — Yaron Cohen
(74) *Attorney, Agent, or Firm* — GREENBLUM & BERNSTEIN, P.L.C.

(57) ABSTRACT

An operation device includes an operation part that is provided so as to move relative to a device body in each of a first direction and a second direction from a neutral position. Touch operations on the panel surface of the operation part are detected by a sensor provided to the operation part. A touch operation on the operation part is designated as an operation for selecting an icon group on a screen. A push operation on the operation part, in the first direction or the second direction, is designated as an operation for determining a selection state on the screen. A one-finger tracing operation on the operation part is designated as an operation for changing an icon selected on the screen. A two-finger tracing operation on the operation part is designated as an operation for changing the screen.

7 Claims, 8 Drawing Sheets

(51) Int. Cl.
*B60K 35/00* (2024.01)
*B60K 35/10* (2024.01)
*B60K 35/22* (2024.01)
*B60K 35/28* (2024.01)
*G06F 3/0354* (2013.01)

(52) U.S. Cl.
CPC .......... *B60K 35/00* (2013.01); *G06F 3/03547* (2013.01); *B60K 35/10* (2024.01); *B60K 35/22* (2024.01); *B60K 35/28* (2024.01); *B60K 2360/143* (2024.01); *B60K 2360/16* (2024.01)

(58) Field of Classification Search
CPC .... B60H 1/00; B60K 35/00; B60K 2370/143; B60K 2370/152; B60K 2370/16; B60K 2360/143; B60K 2360/16; B60K 35/10; B60K 35/28; B60K 35/22; H03K 17/9622; H03K 2217/96054; H01H 25/06
See application file for complete search history.

Fig.5A  Determination Operation
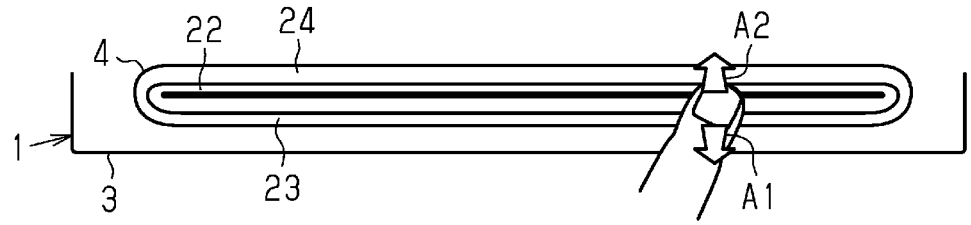
Fig.5B  Swipe Operation (Single Finger)
Fig.5C  Swipe Operation (Multiple Fingers)
Fig.6
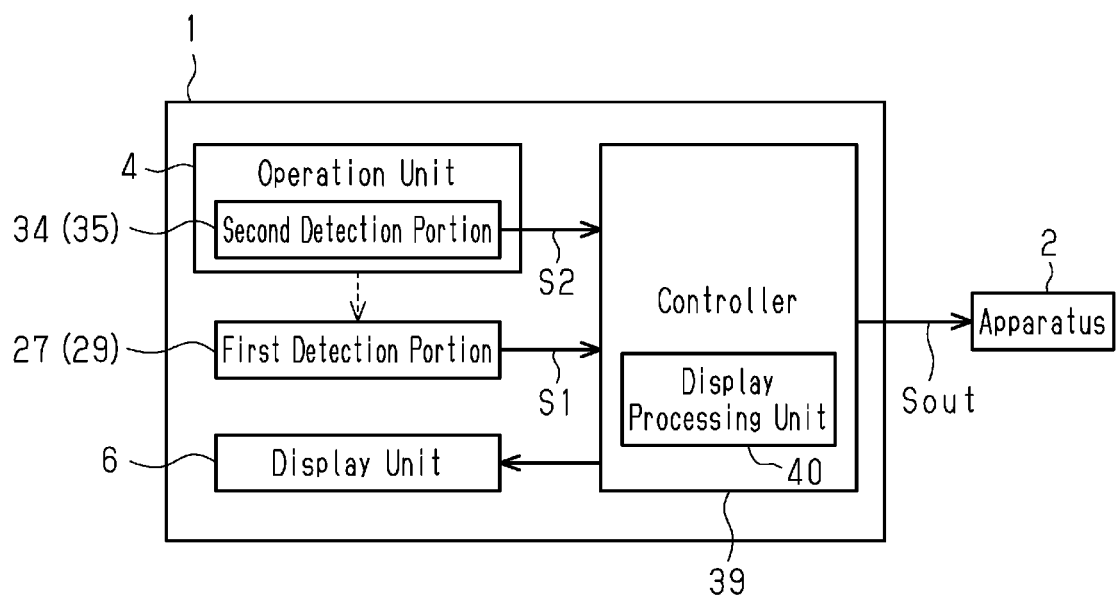

Fig.7
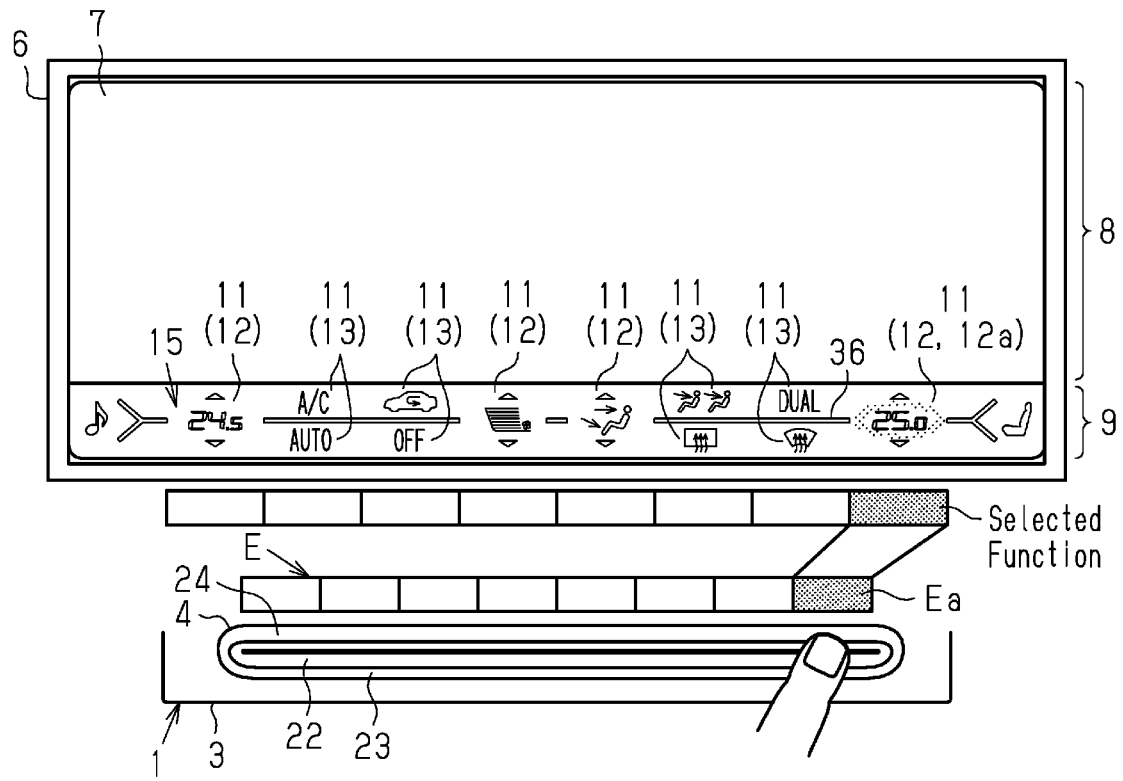
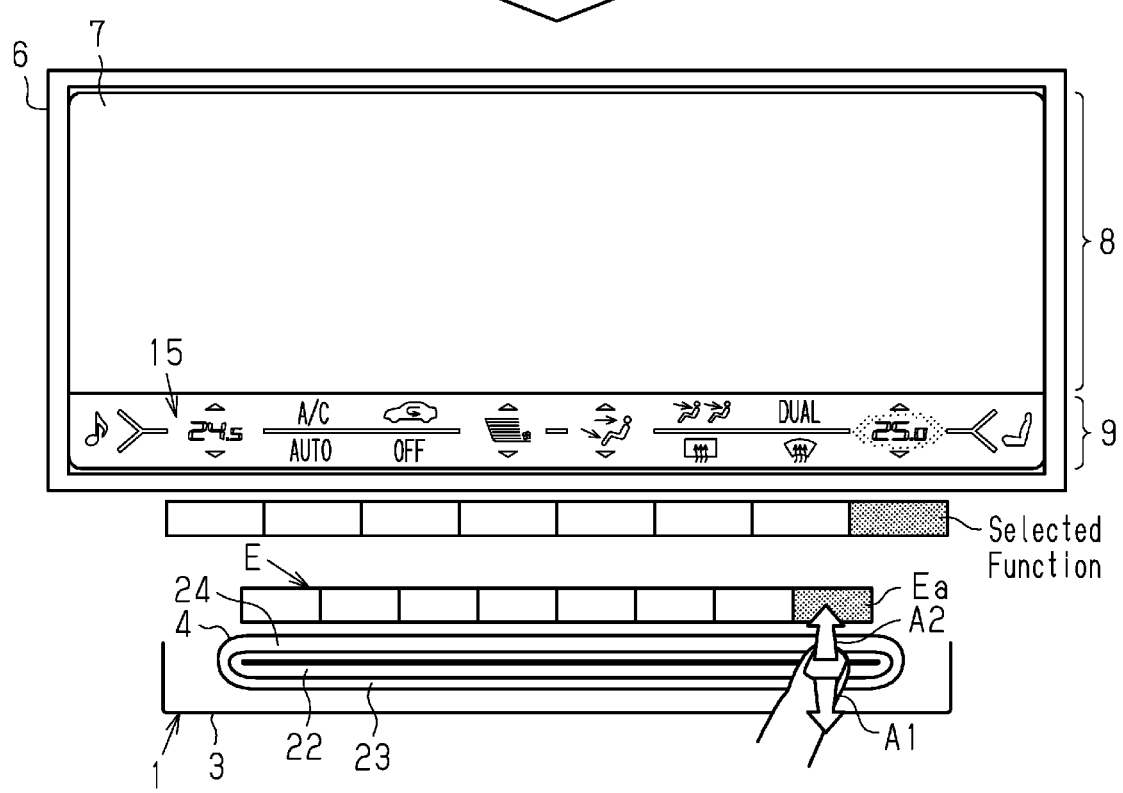

OPERATION DEVICE ENABLING BOTH PUSH AND SWIPE OPERATION

TECHNICAL FIELD

The present invention relates to an operation device that is operated to activate an apparatus.

BACKGROUND ART

A known structure for a vehicle serving as an operation device that activates various types of onboard apparatuses includes an arrangement of switches (refer to, for example, Patent Document 1). Specifically, a group of switches for an air conditioner and a group of switches for an audio device or the like are arranged on a center console or the like inside the passenger compartment. The switches are of various types; for example, push switches, dial switches, lever switches, and the like.

CITATION LIST

Patent Literature

Patent Literature 1: Japanese Laid-Open Patent Publication No. 2014-125181

SUMMARY OF INVENTION

Technical Problem

Functions assigned to such types of switches are often fixed when setting the assigned functions. Thus, for example, when an apparatus operated by a switch is newly added or increased in function, switch functions will need to be expanded and more switches will become necessary. This may increase the number of components or cost. In this manner, it may be difficult to flexibly cope with expansion of operational functions.

Solution to Problem

An operation device according to one embodiment includes an operation unit moved relative to a device body in a first direction and a second direction from a neutral position, a first detection portion that detects an operation moving the operation unit in the first direction and an operation moving the operation unit in the second direction, a second detection portion arranged on the operation unit, the second detection portion detecting an operation in which a user touches the operation unit, and a display processing unit that controls graphics of a display unit displaying a current operational state of the operation unit based on at least one of a first detection signal of the first detection portion and a second detection signal of the second detection portion when the operation unit is operated to set an operational state allowing for at least one of selection and determination. An operation performed on the operation unit includes a swipe operation performed by touching the operation unit and swiping the operation unit.

Advantageous Effects of Invention

The present invention flexibly copes with expansion of operational functions.

BRIEF DESCRIPTION OF DRAWINGS

FIGS. 5A to 5C are diagrams illustrating examples of operations performed with an operation unit.

FIG. 6 is a diagram showing the electric configuration of the operation device.

FIG. 7 is a diagram illustrating how the operation unit is operated and the screen is changed.

DESCRIPTION OF EMBODIMENTS

An operation device according to one embodiment will now be described below.

Figure 1:
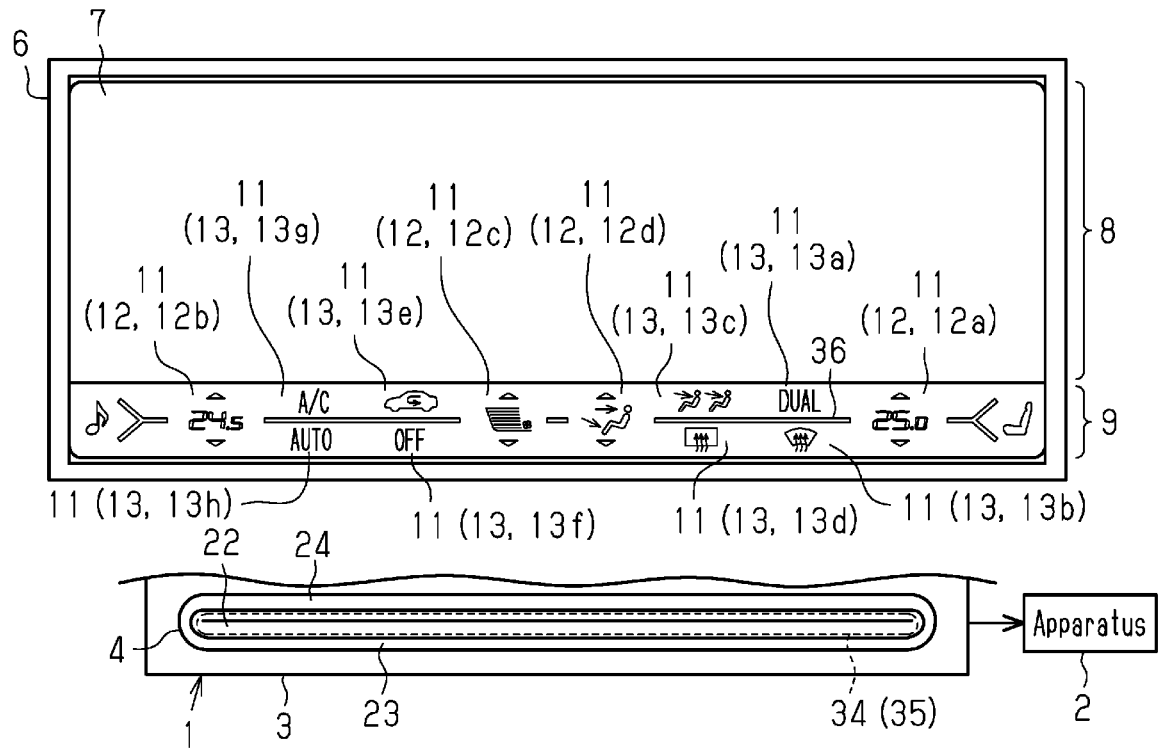
FIG. 1 is a diagram showing the configuration of an operation device according to one embodiment.
Figure 2:
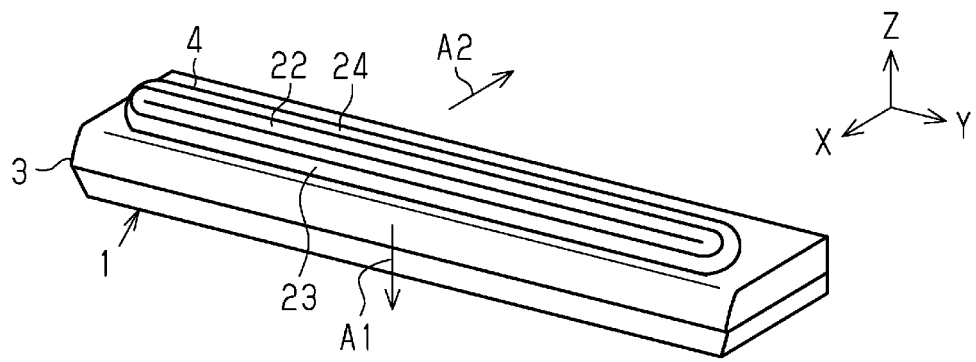
FIG. 2 is a perspective view of the operation device.

As shown in FIGS. 1 and 2, an operation device 1 is an input interface that is operated to set the operation of an apparatus 2. The operation device 1 includes an operation unit 4 moved relative to a device body 3 in a first direction (direction of arrow A1 in FIG. 2) or a second direction (direction of arrow A2 in FIG. 2) from a neutral position. The device body 3 is the body portion of the operation device 1. The device body 3 is a substantially rectangular parallelepiped elongated in, for example, a width direction (Y-axis direction of FIG. 2). When the operation device 1 is, for example, an onboard device, the apparatus 2 may be an air conditioner that air-conditions the passenger compartment, an audio device that plays music and the like, a seat device that adjusts the state of a seat, a steering device that adjusts the state of the steering wheel, or the like.

The operation unit 4 is arranged on the upper surface of the device body 3. The operation unit 4 extends in the width direction (Y-axis direction in FIGS. 1 and 2) of the device body 3.

The operation device 1 is connected to a display unit 6 that displays the current operational state of the operation unit 4. The operation device 1 switches the graphics shown on the display unit 6 when the operation unit 4 is operated. The display unit 6 is formed by, for example, a liquid crystal or an organic EL panel. The display unit 6 may be, for example, a display screen of a car navigation system when the operation device 1 is an onboard device. The display unit 6 displays the current state of the apparatus 2 that is selected or determined with the operation unit 4.

As shown in FIG. 1, a screen 7 of the display unit 6 includes a main display region 8 that always displays an image on the screen 7 and a function display region 9 that switches graphics in accordance with an operation performed on the operation unit 4. The main display region 8 is a region that displays, for example, a map of the car navigation system. When the apparatus 2 operated with the operation unit 4 is an air conditioner, the function display region 9 is a region that displays various types of operational functions of the air conditioner.

The function display region 9 displays various icons 11 related to the air conditioner. The icons 11 include level setting icons 12 that switch levels of a condition in accordance with the number of times determination operations are performed with the operation unit 4 and on/off setting icons 13 that are switched on or off each time a determination operation is performed with the operation unit 4. The level setting icons 12 include, for example, a driver seat temperature setting icon 12a, a passenger seat temperature setting icon 12b, an air conditioning airflow setting icon 12c, an air conditioning mode setting icon 12d, and the like. The on/off setting icons 13 include, for example, a dual-mode setting icon 13a, a windshield defogging icon 13b, a rear air conditioner setting icon 13c, and a rear window defogging icon 13d. The on/off setting icons 13 also include, for example, a recirculation icon 13e, an air conditioning off switching icon 13f, a cooling function on/off switching icon 13g, and an auto-mode on/off switching icon 13h.

Figure 3:
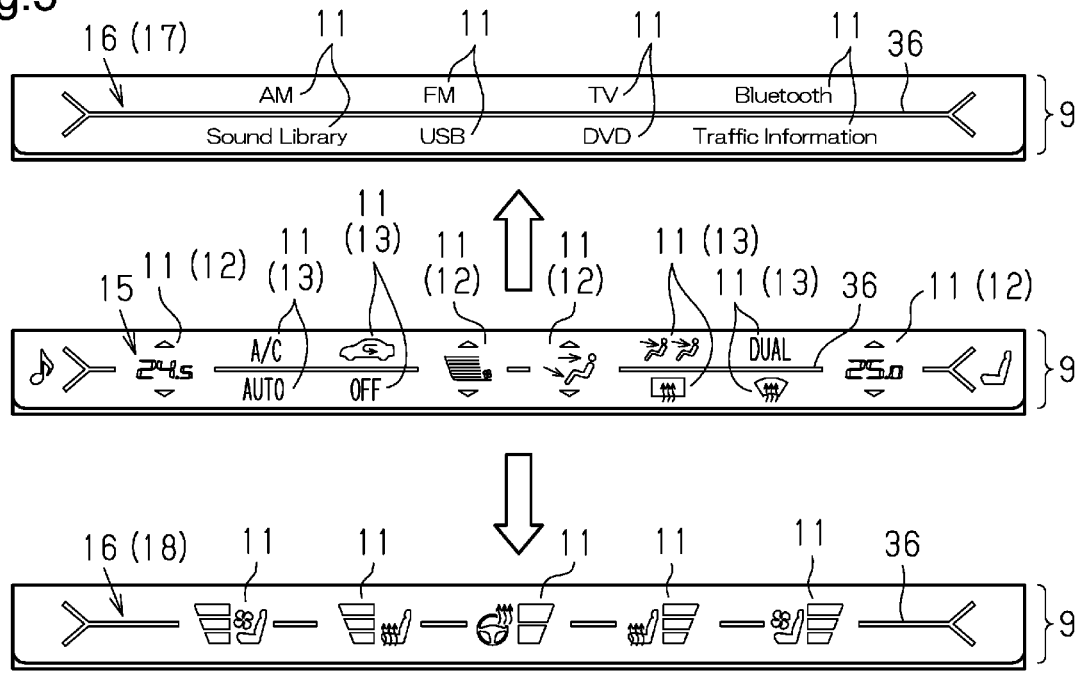
FIG. 3 is a diagram illustrating changes in the graphics shown in a function display region.

As shown in FIG. 3, the screens displayed in the function display region 9 are switchable by operating the operation unit 4. In the present example, the function display region 9 displays a main home screen 15, two switched screens 16 (first switched screen 17 and second switched screen 18) switched from the home screen 15. The home screen 15 of the present example is, for example, an operation screen for the air conditioner. The first switched screen 17 is, for example, an operation screen for the audio device. The second switched screen 18 is, for example, an operation screen for the seat and the steering wheel.

Figure 4:
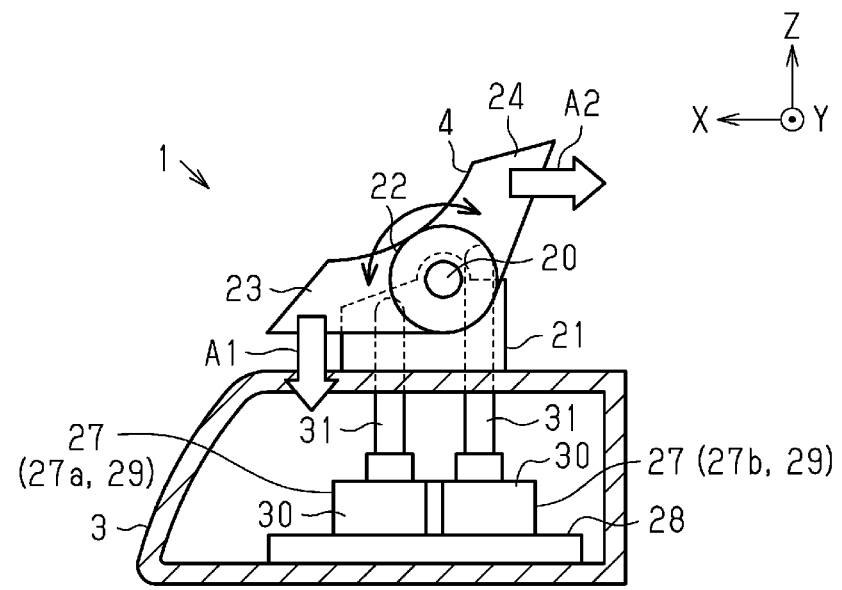
FIG. 4 is a cross-sectional view of the operation device.

As shown in FIG. 4, the operation unit 4 is attached to a base 21 of the device body 3 and is rotatable about a shaft 20 extending in the width direction (Y-axis direction of FIG. 4). The operation unit 4 is movable one step at a time from the neutral position in each of the first direction A1 and the second direction A2. In the present example, the movement of the operation unit 4 about the shaft 20 (referred to as push operation in present example) is a determination operation performed with the operation unit 4. The first direction A1 is a downward direction as viewed from, for example, a user operating the operation unit 4. The second direction A2 is a frontward direction as viewed from, for example, the user operating the operation unit 4. The operation unit 4 is a momentary switch that automatically returns to the neutral position when released after being push-operated in either direction from the neutral position.

The operation unit 4 has, for example, a substantially L-shaped cross section. In the present example, the operation unit 4 has a curved surface shaped in conformance with a finger of a user. Specifically, the operation unit 4 is shaped so that a finger placed on the operation unit 4 at the neutral position can move the operation unit 4 from the neutral position in the first direction A1 or the second direction A2. The operation unit 4 of the present example includes an operation body 22, a first push portion 23 that is pushed to move the operation unit 4 in the first direction A1, and a second push portion 24 that is pushed to move the operation unit 4 in the second direction A2. The first push portion 23 is continuous with the operation body 22 and arranged toward the user from the operation body 22 on the panel of the operation unit 4. The second push portion 24 is continuous with the operation body 22 and arranged toward the other side from the operation body 22 on the panel of the operation unit 4.

The operation device 1 includes first detection portions 27 that detect movement of the operation unit 4 about the shaft 20. The first detection portions 27 of the present example include a first detection portion 27a that detects movement of the operation unit 4 in the first direction A1 and a first detection portion 27b that detects movement of the operation unit 4 in the second direction A2. The first detection portions 27a, 27b are arranged next to each other in the front-rear direction of the device body 3 (X-axis direction of FIG. 4). The first detection portion 27a includes, for example, a tactile switch 29 mounted on a substrate 28 accommodated in the device body 3. The tactile switch 29 includes a switch body 30 and a push rod 31 that switches on or off a contact in the switch body 30. When the push rod 31 of the tactile switch 29 is pushed and lowered by the operation unit 4, the contact in the switch body 30 is switched on.

As shown in FIG. 1, the operation device 1 includes a second detection portion 34 that detects an operation in which the user touches the operation unit 4. The second detection portion 34 is, for example, a touch sensor 35 that detects a touch operation performed on the operation unit 4. The touch sensor 35 is, for example, a capacitive sensor. The touch sensor 35 is arranged over the entire panel of the operation unit 4 in the width direction. The second detection portion 34 detects the position where the panel of the operation unit 4 is touched. In the present example, an operation touching the operation unit 4 (including touch operation and swipe operation) is a selection operation performed with the operation unit 4. The second detection portion 34 detects the touch position on the panel of the operation unit 4 to detect the icon 11 selected in the function display region 9.

As shown in FIG. 5A, with the operation device 1, a push operation performed on the operation unit 4 in the first direction A1 and a push operation performed on the operation unit 4 in the second direction A2 are determination operations. In this case, the operation unit 4 may be operated with any number of fingers. The function of the level setting icons 12 is increased or decreased one step at a time each time the operation unit 4 is push-operated. For example, with the driver seat temperature setting icon 12a, the temperature is set one level lower each time the operation unit 4 is operated in the first direction A1, and the temperature is set one level higher each time the operation unit 4 is operated in the second direction A2.

The function of the on/off setting icons 13 is activated or deactivated each time the operation unit 4 is push-operated in the first direction A1 (second direction A2). In the present example, as shown in FIG. 1, the on/off setting icons 13 include an icon group (13a, 13c, 13e, 13g) displayed in the upper section and an icon group (13b, 13d, 13f, 13h) displayed in the lower section. A push operation in the first direction A1 is designated as a determination operation for selecting the icon group (13b, 13d, 13f, 13h) in the lower section from the icons 11 in the graphics. Further, a push operation in the second direction A2 is designated as a determination operation for selecting the icon group (13a, 13c, 13e, 13g) in the upper section from the icons 11 in the graphics.

As shown in FIG. 5B, with the operation device 1, a swipe operation performed on the panel of the operation unit 4 with a single finger is an operation for selecting an icon 11 in the function display region 9 (hereafter referred to as first swipe operation). A swipe position on the panel of the operation unit 4, that is, a touch position of the finger is detected by the second detection portion 34 of the operation unit 4. An icon 11 selected from the icon group displayed in the function display region 9 is indicated in the graphics. Preferably, the indication in graphics is, for example, performed by emphasizing the area around the selected icon in a bar graphic 36 extending in the width direction of the function display region 9 in the width direction through a color change, a shape change, continuous illumination, intermittent illumination, or a combination of such states.

As shown in FIG. 5C, with the operation device 1, a swipe operation performed on the panel of the operation unit 4 with multiple fingers (two fingers in present example) is an operation for switching screens in the function display region 9 (hereafter referred to as second swipe operation). The second detection portion 34 detects how many fingers are used in a touch operation. In the present example, when the function display region 9 is the home screen 15 and multiple fingers swipe on the panel of the operation unit 4 in the first swipe direction B1 (right direction in drawing), the function display region 9 is switched from the home screen 15 to the first switched screen 17. When the function display region 9 is the home screen 15 and multiple fingers swipe the panel of the operation unit 4 in the second swipe direction B2 (left direction in drawing), the function display region 9 is switched from the home screen 15 to the second switched screen 18.

As shown in FIG. 6, the operation device 1 includes a controller 39 that controls operation of the operation device 1. The controller 39 processes a first detection signal S1 received from the first detection portion 27 and a second detection signal S2 received from the second detection portion 34 in correspondence with an operation moving the operation unit 4 relative to the device body 3 and an operation touching the panel of the operation unit 4 (touch operation, swipe operation) that serve as input operations performed to operate the apparatus 2.

The controller 39 determines, from the first detection signal S1 of the first detection portion 27, whether the operation unit 4 has been push-operated in the first direction A1, whether the operation unit 4 has been push-operated in the second direction A2, or whether the operation unit 4 is in the neutral position. The controller 39 recognizes the touch position on the panel of the operation unit 4 and determines the icon 11 selected on the screen from the second detection signal S2 of the second detection portion 34. The controller 39 recognizes how many fingers are performing a touch operation and switches screens in the function display region 9 from the second detection signal S2 of the second detection portion 34.

The controller 39 determines the operational state of the operation unit 4 from the first detection signal S1 of the first detection portion 27 and the second detection signal S2 of the second detection portion 34. The controller 39 outputs an operation signal Sout based on the determination result to an electronic control unit (ECU) of the apparatus 2 so that the apparatus 2 is operated in accordance with a user operation.

The operation device 1 includes a display processing unit 40 that switches the display states of the display unit 6 based on the operational state of the operation unit 4. The display processing unit 40 is arranged in the controller 39. When the operation unit 4 is operated to set an operation state allowing for at least one of selection and determination, the display processing unit 40 controls the graphics of the display unit 6 displaying the current operational state of the operation unit 4 based on at least one of the first detection signal S1 of the first detection portion 27 and the second detection signal S2 of the second detection portion 34. In the present example, the display processing unit 40 controls the display state of the display unit 6 from the operational state of the operation unit 4 recognized by the controller 39.

The operation of the operation device 1 in the present embodiment will now be described.

Figure 10:
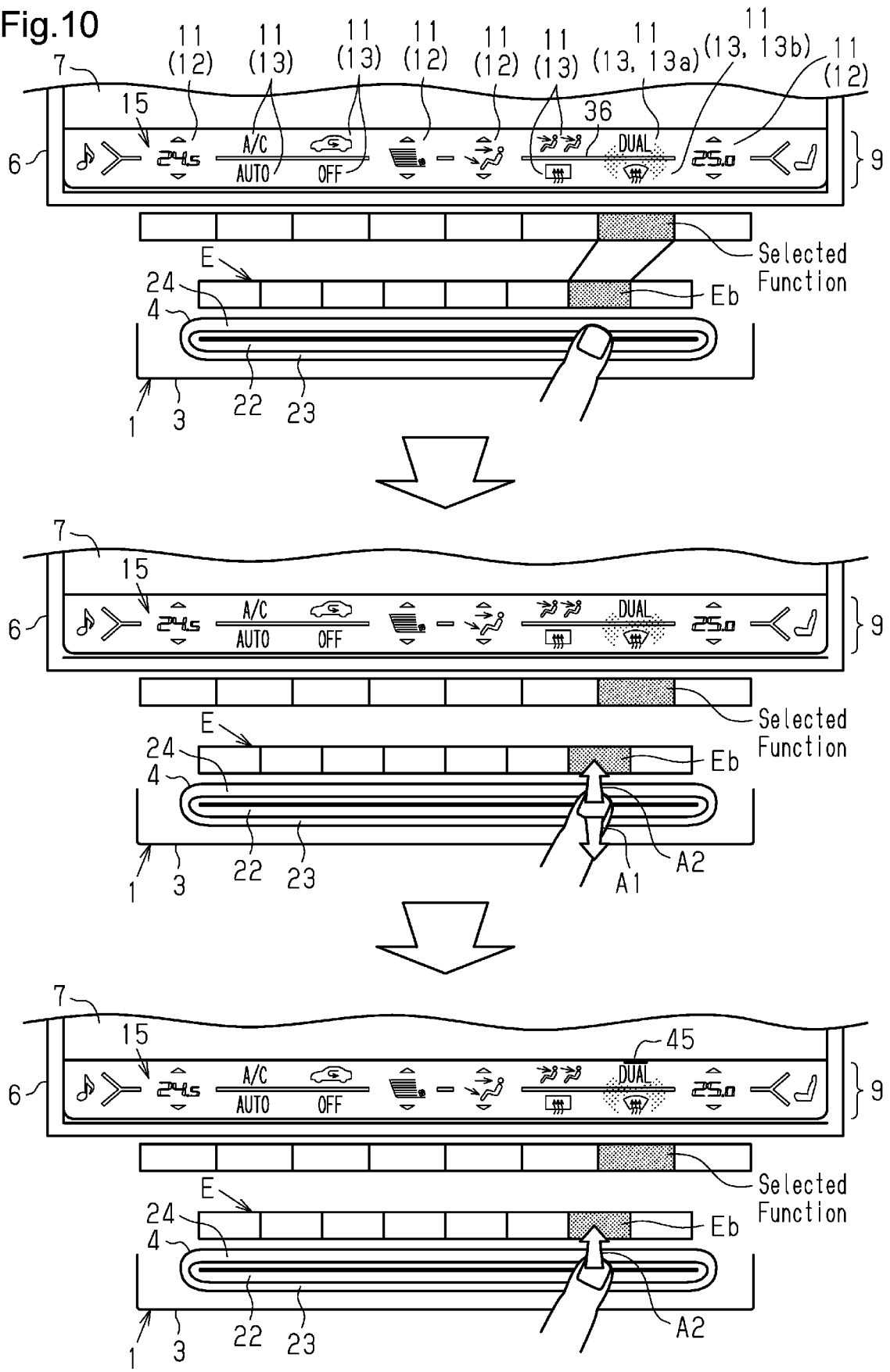
FIG. 10 is a diagram illustrating how the operation unit is operated and the screen is changed.
Figure 11:
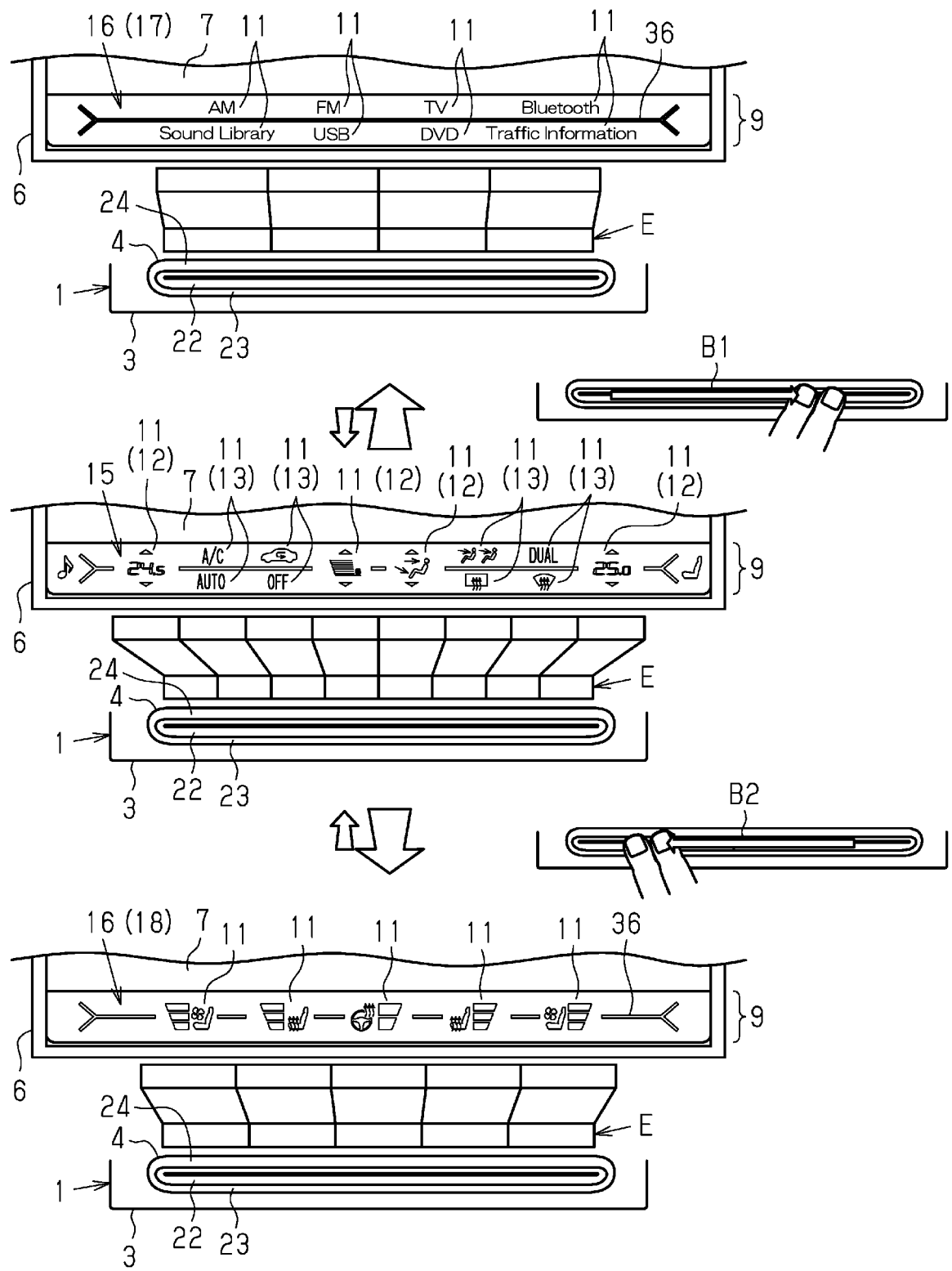
FIG. 11 is a diagram illustrating how the operation unit is operated and a detection area is divided.

As shown in FIG. 7, the controller 39 divides a detection area E of the second detection portion 34 in accordance with the display state of the display unit 6. In the example of FIG. 7, the controller 39 divides the detection area E for a touch operation on the second detection portion 34 in accordance with the number of columns of the icons 11 displayed on the display unit 6. In one example, the controller 39 divides the detection area E of the second detection portion 34 into detection region segments in accordance with the display state of the display unit 6. In the example of FIG. 7, the controller 39 divides the detection area E for a touch operation on the second detection portion 34 into detection region segments, the number of which is the same as the number of columns of the icons 11 displayed on the display unit 6 and assigns the detection region segments to the corresponding columns of the icons 11 displayed on the display unit 6. FIGS. 7, 10, and 11 illustrate the correspondence between the detection region segments and the rows of the icons 11 displayed on the display unit 6. When the home screen 15 is displayed in the function display region 9, the detection area E is divided into eight detection region segments having the same number as the number of columns of the icons 11 displayed in the home screen 15. Thus, a detection region segment Ea at the right end of the detection area E in FIG. 7 is a touch region corresponding to the driver seat temperature setting icon 12a.

To operate the driver seat temperature setting icon 12a, a selection operation is performed by touching the detection region segment Ea at the right end. In this case, when a touch operation is performed on the detection region segment Ea in the detection area E from the second detection signal S2 of the second detection portion 34, the display processing unit indicates the location that corresponds to the driver seat temperature setting icon 12a in the bar graphic 36 of the home screen 15. In this manner, the indication emphasizes the driver seat temperature setting icon 12a to notify the user that the driver seat temperature setting icon 12a is currently in a selected state.

To lower the temperature, the operation unit 4 is push-operated in the first direction A1. In this case, the temperature is lowered one level at a time each time the push operation is performed. To raise the temperature, the operation unit 4 is push-operated in the second direction A2. In this case, the temperature is raised one level at a time each time the push operation is performed.

Figure 8:
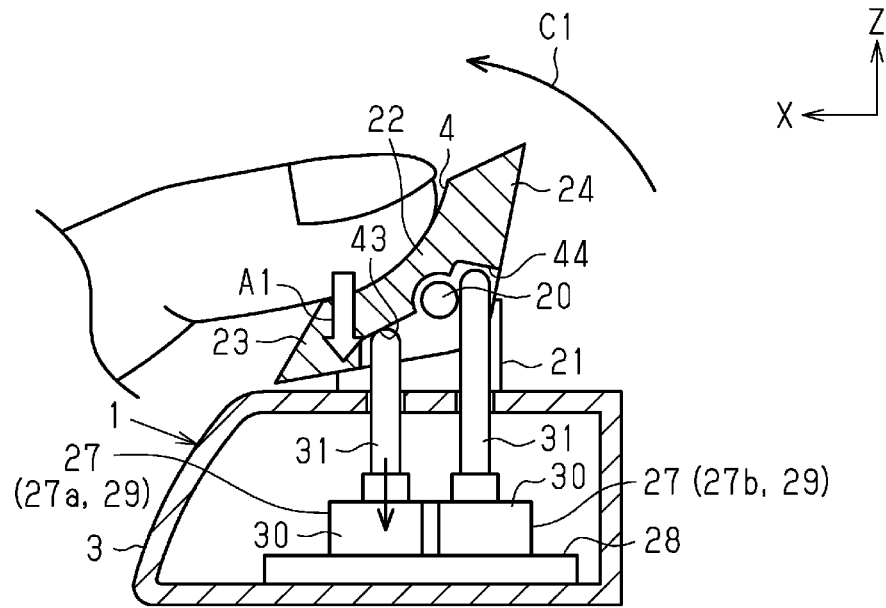
FIG. 8 is a diagram showing a push-operation performed in a first direction on the operation unit.

As shown in FIG. 8, when the operation unit 4 is push-operated in the first direction A1, the operation unit 4 is rotated about the shaft 20 in the direction indicated by arrow C1. When the operation unit 4 is rotated about the shaft 20 in the direction indicated by arrow C1, an abutment surface 43 on the rear surface of the operation unit 4 lowers the push rod 31 of the first detection portion 27a to activate the contact in the switch body 30 of the first detection portion 27a. Thus, the first detection portion 27a detects the push operation performed on the operation unit 4 in the first direction A1.

When the first detection portion 27a detects a push operation performed on the operation unit 4 in the first direction A1, the controller 39 outputs an operation signal Sout indicative of the detection to the air conditioner. This lowers the selected air conditioning temperature one level from the current state.

Further, the display processing unit 40 switches the current state of the air conditioning temperature displayed on the display unit 6 to the changed temperature setting. Specifically, if the current temperature setting is 25° C. and a single push operation is performed on the operation unit 4 in the first direction A1 to lower the temperature setting by 0.5° C., upon detection of the single push operation for lowering the temperature, the display processing unit 40 changes the temperature displayed on the display unit 6 to 24.5° C., which is lowered by 0.5° C. from 25° C. that was previously set.

Figure 9:
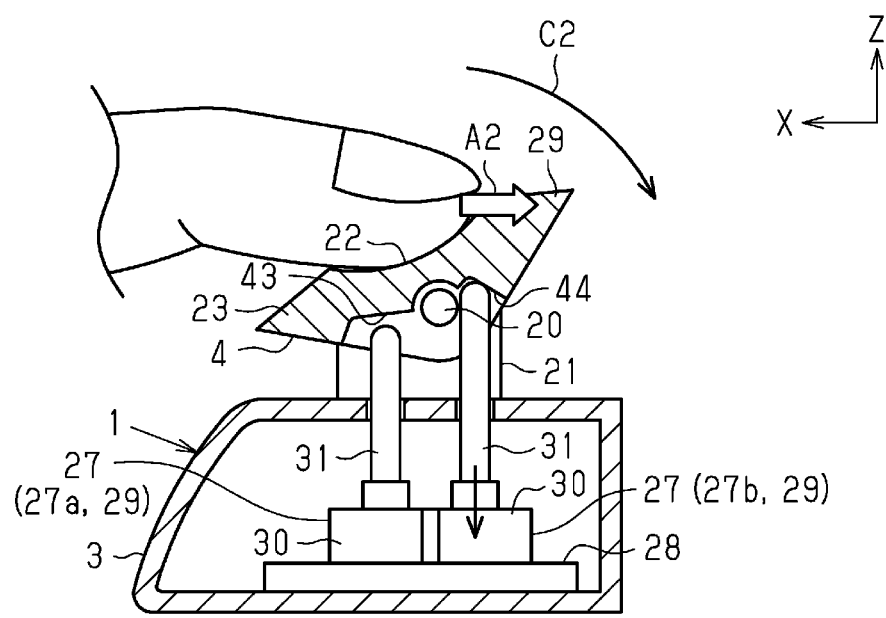
FIG. 9 is a diagram showing a push-operation performed in a second direction on the operation unit.

As shown in FIG. 9, when the operation unit 4 is push-operated in the second direction A2, the operation unit 4 is rotated about the shaft 20 in the direction indicated by arrow C2. When the operation unit 4 is rotated about the shaft 20 in the direction indicated by arrow C2, an abutment surface 44 on the rear surface of the operation unit 4 lowers the push rod 31 of the first detection portion 27b to activate the contact in the switch body 30 of the first detection portion 27b. Thus, the first detection portion 27b detects the push operation performed on the operation unit 4 in the second direction A2.

When the first detection portion 27b detects the push operation performed on the operation unit 4 in the second direction A2, the controller 39 outputs an operation signal Sout indicative of the detection to the air conditioner. This raises the selected air conditioning temperature one level from the current state.

Further, the display processing unit 40 switches the current state of the air conditioning temperature displayed on the display unit 6 to the changed temperature setting. Specifically, if the current temperature setting is 25° C. and a single push operation is performed on the operation unit 4 in the second direction A2 to raise the temperature setting by 0.5° C., upon detection of the single push operation for raising the temperature, the display processing unit 40 changes the temperature displayed on the display unit 6 to 25.5° C., which is raised by 0.5° C. from 25° C. that was previously set.

As shown in FIG. 10, to switch a selected icon 11, the first swipe operation is performed on the panel of the operation unit 4, that is, the panel of the operation unit 4 is swiped laterally with a single finger. In the example of FIG. 10, the panel of the operation unit 4 is swiped leftward with the single finger, which is placed on the panel, to switch the selected icon 11 from the driver seat temperature setting icon 12a to the group of the dual-mode setting icon 13a and the windshield defogging icon 13b in the next column. When detecting a touch operation performed on a detection region segment Eb next to the detection region segment Ea in the detection area E, the controller 39 switches the selected icon 11 from the driver seat temperature setting icon 12a to the next group of the dual-mode setting icon 13a and the windshield defogging icon 13b. In one example, when the controller 39 detects a touch operation performed with a single finger on the detection region segment Ea corresponding to the selected driver seat temperature setting icon 12a and then detects a swipe operation performed by swiping the panel with the single finger, which is placed on the panel, from the detection region segment Ea to the next detection region segment Eb, that is, when the controller 39 detects a first swipe operation performed from the detection region segment Ea to the detection region segment Eb, the controller 39 switches the selected icon 11 from the driver seat temperature setting icon 12a to the next group of the dual-mode setting icon 13a and the windshield defogging icon 13b.

In this case, when a touch operation is performed on the detection region segment Eb in the detection area E from the second detection signal S2 of the second detection portion 34, the display processing unit 40 indicates the location that corresponds to the group of the dual-mode setting icon 13a and the windshield defogging icon 13b in the bar graphic 36 of the home screen 15. In this manner, the indication emphasizes the group of the dual-mode setting icon 13a and the windshield defogging icon 13b to notify the user that the group of the dual-mode setting icon 13a and the windshield defogging icon 13b is currently in a selected state.

To activate the dual mode function, the operation unit 4 is push-operated once in the second direction A2 with the finger placed on the detection region segment Eb of the detection area E of the operation unit 4. This activates the dual mode function. Preferably, an indicator 45 of the dual-mode setting icon 13a is illuminated in the function display region 9 when the dual mode function is activated. The dual mode function is activated or deactivated each time the operation unit 4 is push-operated in the second direction A2.

To activate the windshield defogging function, the operation unit 4 is push-operated once in the first direction A1 with the finger placed on the detection region segment Eb of the detection area E of the operation unit 4. This activates the windshield defogging function. Preferably, an indicator (not shown) of the windshield defogging icon 13b is illuminated in the function display region 9 when the windshield defogging function is activated. The windshield defogging function is activated or deactivated each time the operation unit 4 is push-operated in the first direction A1.

As shown in FIG. 11, to switch screens of the function display region 9, the second swipe operation is performed on the panel of the operation unit 4, that is, the operation unit 4 is swiped with multiple fingers (two fingers in FIG. 11). In the present example, if the display processing unit 40 recognizes from the second detection signal S2 of the second detection portion 34 that a lateral swipe operation has been performed on the detection area E with multiple fingers touching the detection area E, the display processing unit 40 changes the function display region 9 from the home screen 15 to a switched screen 16.

In the present example, when a swipe operation performed with multiple fingers on the panel of the operation unit 4 in the first swipe direction B1 is detected, the display processing unit 40 changes the home screen 15 to the first switched screen 17. The first switched screen 17 of the present example is, for example, the operation screen for the audio device. Thus, the function display region 9 displays icon groups corresponding to various types of functions of the audio device. Preferably, the displayed first switched screen 17 automatically returns to the original home screen 15 if a predetermined time elapses without any operation performed.

Further, the controller 39 divides the detection area E for a touch operation on the second detection portion 34 in accordance with the number of columns of display icons of the first switched screen 17 displayed on the display unit 6. In one example, the controller 39 divides the detection area E for a touch operation on the second detection portion 34 into detection region segments, the number of which is the same as the number of the columns of the display icons of the first switched screen 17 displayed on the display unit 6 and assigns the detection region segments to the corresponding columns of the display icons of the first switched screen 17. When the first switched screen 17 is displayed, the detection area E is divided into four detection region segments, the number of which is the same as the number of the columns of the display icons in the first switched screen 17. Various types of functions of the audio device are set when a determination operation is performed on the operation unit 4 by selectively touching the four detection region segments in the detection area E in the same manner as the home screen 15.

When the display processing unit 40 detects a swipe operation performed with multiple fingers on the panel of the operation unit 4 in the second swipe direction B2, the display processing unit 40 changes the home screen 15 to the second switched screen 18. The second switched screen 18 of the present example is, for example, the operation screen for the seat and the steering wheel. Thus, the function display region 9 displays icon groups corresponding to the functions of the seat and the steering wheel. Preferably, after the second switched screen 18 is displayed, the screen automatically returns to the original home screen if a predetermined time elapses without any operation performed.

Further, the controller 39 divides the detection area E for a touch operation on the second detection portion 34 in accordance with the number of columns of display icons of the second switched screen 18 displayed on the display unit 6. In one example, the controller 39 divides the detection area E for a touch operation on the second detection portion 34 into detection region segments, the number of which is the same as the number of the columns of the display icons of the second switched screen 18 displayed on the display unit 6 and assigns the detection region segments to the corresponding columns of the display icons of the second switched screen 18. When the second switched screen 18 is displayed, the detection area E is divided into five detection region segments, the number of which is the same as the number of the columns of the display icons in the second switched screen 18. Various types of functions of the seat and the steering wheel are set when a determination operation is performed on the operation unit 4 by selectively touching the five detection region segments in the detection area E in the same manner as the home screen 15.

The operation device 1 in the above embodiment has the following advantages.

(1) The operation device 1 includes the operation unit 4, the first detection portions 27, the second detection portion 34, and the display processing unit 40. The operation unit 4 is moved relative to the device body 3 in the first direction A1 and the second direction A2 from the neutral position. The first detection portions 27 detect an operation moving the operation unit 4 in the first direction A1 and an operation moving the operation unit 4 in the second direction A2. The second detection portion 34 is arranged in the operation unit 4 and detects when the user touches the operation unit 4. When the operation unit 4 is operated to set the operational state allowing for at least one of selection and determination, the display processing unit 40 controls the graphics of the display unit 6 displaying the current operational state of the operation unit 4 based on at least one of the first detection signal S1 of the first detection portion 27 and the second detection signal S2 of the second detection portion 34. Operations performed on the operation unit 4 include a swipe operation performed by touching the operation unit 4 and swiping the operation unit 4.

With the configuration of the present example, an operation moving the operation unit 4 in the first direction A1, an operation moving the operation unit 4 in the second direction A2, an operation touching the operation unit 4, and an operation swiping the operation unit 4 are accepted as input operations. This increases the variety of input operations. This allows for the expansion of operational functions to be flexibly coped with.

(2) Swipe operations include the first swipe operation performed with a single finger and the second swipe operation performed with multiple fingers. With this configuration, the operational state of the operation unit 4 may be changed by a simply changing the number of fingers used in a swipe operation.

(3) One of the first swipe operation and the second swipe operation is an operation for performing a selection on the same screen and the other one of the first swipe operation and the second swipe operation is an operation for switching screens on the display unit 6. With this configuration, the screen of the display unit 6 can be readily changed to another screen by merely changing the number of fingers swiping the operation unit 4.

(4) At least one of an operation moving the operation unit 4 in the first direction A1 and an operation moving the operation unit 4 in the second direction A2 is a determination operation performed to determine a selection state. With this configuration, an operational load is required to move the operation unit 4. Thus, a determination operation will have a tactile feel.

(5) The controller 39 of the operation device 1 controls activation of at least one of a selection operation performed with the operation unit 4 and a determination operation performed with the operation unit 4, which determines the operational state selected in the selection operation, based on at least one of the first detection signal S1 and the second detection signal S2. With this configuration, the operation device 1 can include the controller 39 as a single unit device.

(6) The controller 39 divides the detection area E of the second detection portion 34 into segments in accordance with the display state of the display unit 6. This configuration allows the detection area E of the operation unit 4 to be divided into segments in accordance with the display state of the display unit 6 when switching the graphics of the display unit 6. Thus, the assigned pattern of the detection area E in the operation unit 4 corresponds to the display state of the display unit 6. This improves the operability of the operation unit 4.

(7) When recognizing a determination operation performed on the operation unit 4 from at least one of the first detection signal S1 and the second detection signal S2, the controller 39 outputs an operation signal Sout in accordance with the determination operation to an external device. With this configuration, the operation device 1 outputs the operation signal Sout in accordance with the determination operation performed on the operation unit 4.

The present embodiment may be modified as follows. The present embodiment and the following modifications can be combined if the combined modifications remain technically consistent with each other.

Figure 12A:
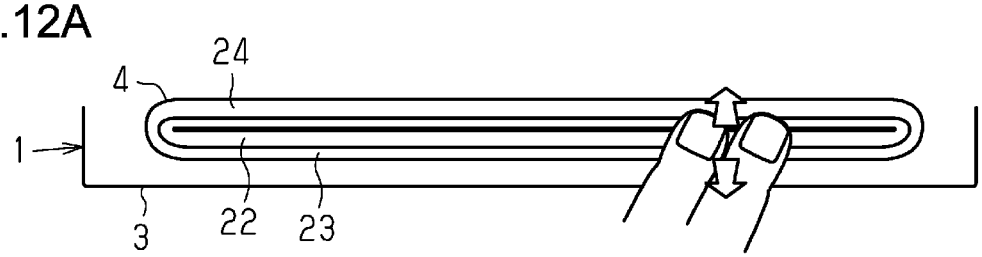
FIGS. 12A to 12C are diagrams showing operation patterns of an operation unit in a modified example.

As shown in FIG. 12A, a push operation performed with multiple fingers may be an operation for switching the screen in the function display region 9.

Figure 12B:

As shown in FIG. 12B, repeated push operations performed on the operation unit 4 in the first direction A1 or the second direction A2 may be a drag operation. For example, two push operations performed on the operation unit 4 may correspond to a double-click operation that allows for dragging on the screen when detected.

Figure 12C:
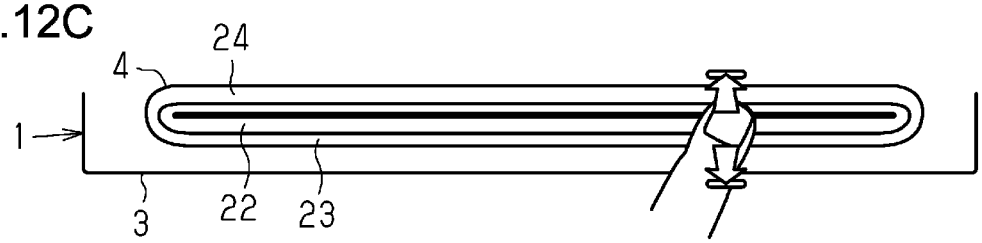

As shown in FIG. 12C, a push operation performed on the operation unit 4 and held for a certain period in the first direction A1 or the second direction A2 may correspond to a press-and-hold operation that is a continuous determination operation.

The operation unit 4 may be arranged close to or far from the display unit 6.

The operation unit 4 does not need to be of a rotation type rotated about a shaft. Instead, the operation unit 4 may be changed to be, for example, of a push type, a swipe type, or the like.

The operation unit 4 allows a push operation to be performed over one step in each direction. Instead, the operation unit 4 may, for example, allow a push-operation to be performed over more than one step in each direction.

The first direction A1 and the second direction A2 of the operation unit 4 do not need to be orthogonal to each other. The first direction A1 and the second direction A2 only need to intersect each other.

An operation on the operation unit 4 in the first direction A1 and an operation on the operation unit 4 in the second direction A2 do not need to be push operations. Alternatively, the operation on the operation unit 4 in the first direction A1 and the operation on the operation unit 4 in the second direction A2 may be changed to, for example, swipe operations, rotation operations, or the like.

The operation unit 4 does not need to be shaped to extend in the width direction and have an L-shaped cross section. Instead, the operation unit 4 may be shaped to be, for example, square, elliptic, circular, or the like in cross section.

The first detection portion 27 does not need to be the tactile switch 29. Instead, the first detection portion 27 may be changed to another type of switch. Further, the first detection portion 27 does not need to be a mechanical switch such as the tactile switch 29. Instead, the first detection portion 27 may be a sensor.

The touch sensor 35 does not need to be formed over the entire panel of the operation unit 4. Instead, the touch sensor 35 may be, for example, divided into sections, one for each icon.

The touch sensor 35 does not need to be of a capacitive type. Instead, the touch sensor 35 may be, for example, a sensor of another type such as a resistive film type.

The second detection portion 34 does not need to be arranged on the surface of the operation unit 4. Instead, the second detection portion 34 may be, for example, arranged on the rear surface of the operation unit 4 to allow a touch operation performed on the rear surface to be detected.

The second detection portion 34 does not need to be the touch sensor 35. Instead, the second detection portion 34 may be, for example, a switch of a mechanical type.

The first swipe operation may be an operation for switching screens and the second swipe operation may be an operation for switching icon groups.

The swipe operation does not have to be of two types, that is, the operation using a single finger and the operation using two fingers. The swipe operation may be of three types in total by further including an operation using three fingers.

The push operation on the operation unit 4 does not need to be a determination operation. Instead, the push operation may be a selection operation.

The touch operation on the operation unit 4 does not need to be a selection operation. Instead, the touch operation may be a determination operation. For example, quick touch operations (such as double-click operation) on the panel of the operation unit 4 may be a determination operation.

The number of switched screens 16 is not limited to two, and there may be three or more switched screens 16.

The display processing unit 40 does not need to be arranged in the controller 39. Instead, the display processing unit 40 may be separated from the controller 39.

The controller 39 and the display processing unit 40 do not need to execute software processing for all of their processes. For example, the controller 39 and the display processing unit 40 may include a dedicated hardware circuit (such as application-specific integrated circuit: ASIC) that executes hardware processing for at least part of their processes. Specifically, the controller 39 and the display processing unit 40 may be circuitry including [1] one or more processors that operate according to a computer program (software), [2] one or more dedicated hardware circuits that execute at least part of various processes, or [3] a combination thereof. The processor includes a CPU and memory such as RAM and ROM. The memory stores program code or commands configured to cause the CPU to execute processes. The memory, or computer-readable media, include any type of media that are accessible by general-purpose computers or dedicated computers.

The operation device 1 does not need to be applied to an onboard device and may be applied to any other apparatus or device.

While the present disclosure is described with reference to examples, the present disclosure is not limited to the example or the configuration of the example. The present disclosure includes various variations and modifications within an equivalent range. In addition, various combinations and forms and other combinations and forms, which include only one element or more, shall be within the scope or a range of ideas of the present disclosure.

The invention claimed is:

1. An operation device, comprising: an operation unit and a device body, wherein the operation unit protrudes from the device body and is configured to move relative to the device body in a first direction and a second direction from a neutral position; a first detection portion that detects an operation moving the operation unit in the first direction and an operation moving the operation unit in the second direction; a second detection portion arranged on the operation unit, the second detection portion detecting an operation in which a user touches the operation unit; and a display processing unit that controls graphics of a display unit displaying a current operational state of the operation unit based on a first detection signal of the first detection portion and/or a second detection signal of the second detection portion in a state that the operation unit is operated to set an operational state allowing for selection and/or determination, wherein an operation performed on the operation unit includes a swipe operation performed by touching the operation unit and swiping the operation unit in a direction orthogonal to the operation moving the operation unit in the first direction and/or the operation moving the operation unit in the second direction, wherein the operation unit is configured to be pushed in both the first direction and the second direction, and wherein the first direction and the second direction are oriented generally perpendicular to each other.

2. The operation device according to claim 1, wherein the swipe operation includes a first swipe operation performed with a single finger and a second swipe operation performed with multiple fingers.

3. The operation device according to claim 2, wherein one of the first swipe operation and the second swipe operation is a selection operation performed on the same screen and the other one of the first swipe operation and the second swipe operation is an operation for switching screens on the display unit.

4. The operation device according to claim 1, wherein the operation moving the operation unit in the first direction and/or the operation moving the operation unit in the second direction is a determination operation for determining a selection state.

5. The operation device according to claim 1, further comprising:
   a controller that controls activation of a selection operation performed with the operation unit and a determination operation performed with the operation unit to determine an operational state selected by the selection operation based on the first detection signal and/or the second detection signal.

6. The operation device according to claim 5, wherein the controller divides a detection area of the second detection portion into segments in accordance with a display state of the display unit.

7. The operation device according to claim 5, wherein in a state that the controller recognizes the determination operation performed on the operation unit from the first detection signal and/or the second detection signal, the controller outputs an operation signal corresponding to the determination operation to an external device.

* * * * *